(12) United States Patent
Nakamura

(10) Patent No.: US 10,996,294 B2
(45) Date of Patent: May 4, 2021

(54) MRI APPARATUS AND RF AMPLIFICATION CIRCUIT

(71) Applicant: Canon Medical Systems Corporation, Otawara (JP)

(72) Inventor: Haruki Nakamura, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 16/505,873

(22) Filed: Jul. 9, 2019

(65) Prior Publication Data

US 2020/0018805 A1 Jan. 16, 2020

(30) Foreign Application Priority Data

Jul. 11, 2018 (JP) .............................. JP2018-131384

(51) Int. Cl.
*G01R 33/36* (2006.01)
*G01R 33/54* (2006.01)
*H03F 3/189* (2006.01)

(52) U.S. Cl.
CPC ....... *G01R 33/3614* (2013.01); *G01R 33/543* (2013.01); *H03F 3/189* (2013.01); *H03F 2200/451* (2013.01)

(58) Field of Classification Search
CPC ............... G01R 33/36; G01R 33/3607; G01R 33/3614; G01R 33/54; G01R 33/543; G01R 33/546; G01R 33/5608; G01R 33/561
USPC .................................. 324/309, 314, 318, 322
See application file for complete search history.

(56) References Cited

U.S. PATENT DOCUMENTS

| 2006/0061358 | A1* | 3/2006 | Hargreaves | G01R 33/4833 324/307 |
|---|---|---|---|---|
| 2008/0284439 | A1* | 11/2008 | Xu | G01R 33/4824 324/322 |
| 2010/0141257 | A1* | 6/2010 | Graesslin | G01R 33/3607 324/314 |
| 2011/0215868 | A1* | 9/2011 | Thakker | H03F 3/45475 330/252 |
| 2011/0298458 | A1* | 12/2011 | Ookawa | A61B 5/055 324/309 |
| 2012/0179024 | A1* | 7/2012 | Delforge | H04B 1/04 600/410 |
| 2015/0195118 | A1* | 7/2015 | Yan | H04B 1/0475 375/297 |
| 2016/0003925 | A1* | 1/2016 | Nakamura | G01R 33/5659 324/322 |
| 2017/0212193 | A1* | 7/2017 | Song | H03F 1/3247 |
| 2018/0031658 | A1* | 2/2018 | Kobayashi | G01R 33/5608 |

(Continued)

FOREIGN PATENT DOCUMENTS

JP 2010-525855 7/2010

*Primary Examiner* — Steven L Yeninas
(74) *Attorney, Agent, or Firm* — Oblon, McClelland, Maier & Neustadt, L.L.P.

(57) ABSTRACT

According to one embodiment, an MRI apparatus includes an amplifier and a control circuit. The amplifier amplifies an RF pulse and supplies it to an RF coil. The control circuit is configured to determine whether an output RF pulse outputted from the amplifier is fed back to an input side of the amplifier to correct an input RF pulse to be inputted into the amplifier, based on a determination value being set according to a slew rate of the input RF pulse.

15 Claims, 6 Drawing Sheets

(56) References Cited

U.S. PATENT DOCUMENTS

2018/0210046 A1\* 7/2018 Xu ................... G01R 33/3628
2020/0088816 A1\* 3/2020 Murakoshi ............. H03F 3/189

\* cited by examiner

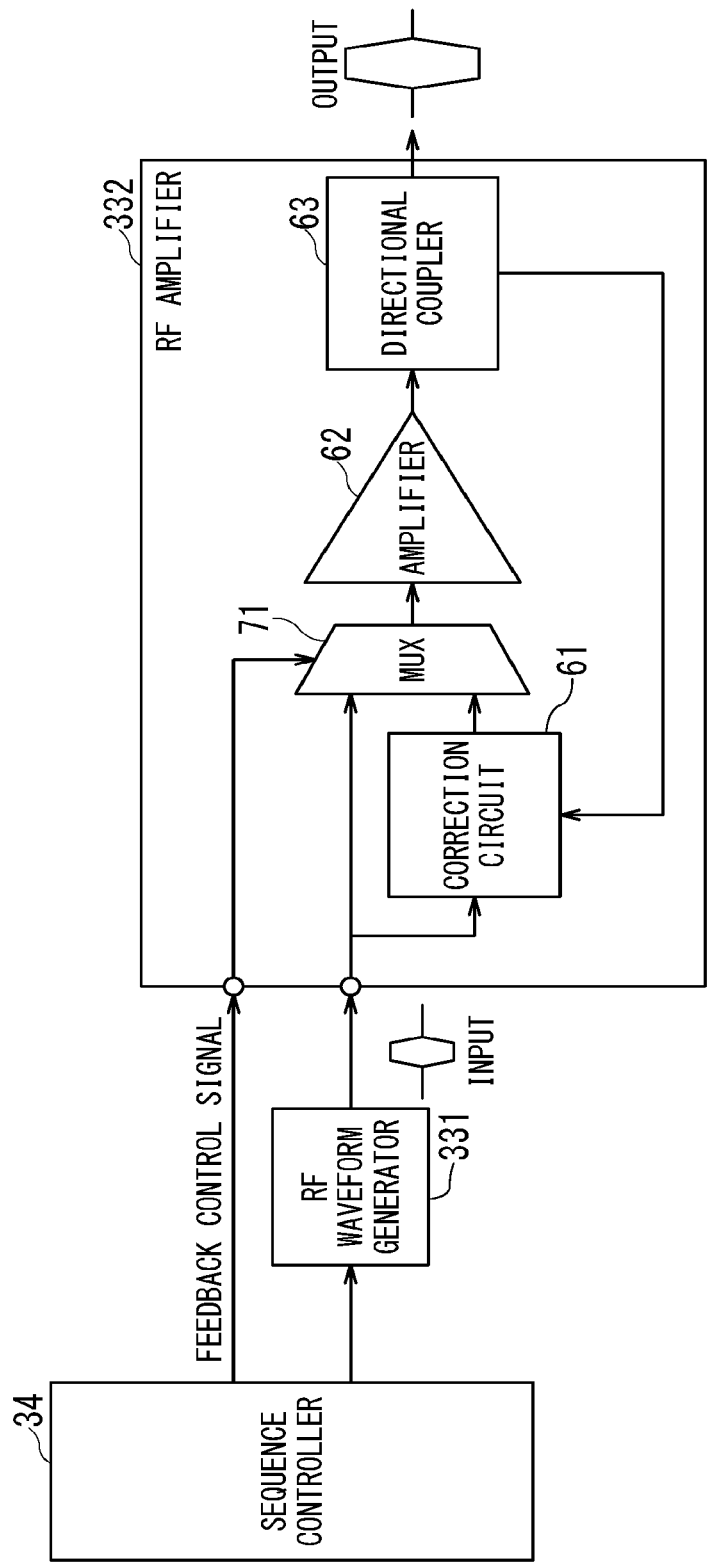
F I G. 5

MRI APPARATUS AND RF AMPLIFICATION CIRCUIT

CROSS-REFERENCE TO RELATED APPLICATIONS

This application claims the benefit of priority of Japanese Patent Application No. 2018-131384, filed Jul. 11, 2018, the entire contents of which are incorporated herein by reference.

FIELD

Embodiments described herein relate generally to an MRI (Magnetic Resonance Imaging) apparatus and an RF (Radio Frequency) amplification circuit.

BACKGROUND

Since an MRI apparatus has no problem with exposure to X-rays and can perform internal examination in a minimally invasive manner, an MRI apparatus is an essential modality in the current medical treatment.

An MRI apparatus is an imaging apparatus that magnetically excites nuclear spin of an object placed in a static magnetic field by applying an RF pulse having the Larmor frequency and reconstructs an image on the basis of MR (Magnetic Resonance) signals emitted from the object due to the excitation. In order to acquire the MR signals, high frequency pulses, i.e., RF pulses are applied to the object. Each RF pulse is amplified by an amplifier so as to have a predetermined power and radiated to the object. From the viewpoint of the safety of the object and accuracy of each image to be acquired, each RF pulse outputted from the amplifier is required to have stability and linearity.

As a method for improving stability and correcting non-linearity of each RF pulse outputted from the amplifier, feedback processing is included. The feedback processing is processing of monitoring at least a part of an RF pulse actually outputted from the amplifier and then correcting the RF pulse to be inputted to the amplifier on the basis of the outputted RF pulse.

In addition to sinc pulses, ultrashort square waves and trapezoidal waves have come to be used as RF pulses applied to the object. However, square waves and trapezoidal waves have a sharp rise (a high slew rate). For this reason, when the feedback processing is applied to RF pulses that are square waves or trapezoidal waves, the rise of each RF pulse outputted from the amplifier is deteriorated to degrade the image quality in some cases.

BRIEF DESCRIPTION OF THE DRAWINGS

FIG. 5 is a block diagram for illustrating a configuration according to the second control method of selectively switching the feedback processing to be performed or not according to the slew rate in the present embodiment.

DETAILED DESCRIPTION

Hereinbelow, a description will be given of respective embodiments of an MRI apparatus and an RF amplification circuit in detail with reference to the accompanying drawings. In general, according to one embodiment, an MRI apparatus includes an amplifier and a control circuit. The amplifier amplifies an RF pulse and supplies it to an RF coil. The control circuit is configured to determine whether an output RF pulse outputted from the amplifier is fed back to an input side of the amplifier to correct an input RF pulse to be inputted into the amplifier, based on a determination value being set according to a slew rate of the input RF pulse.

Figure 1:
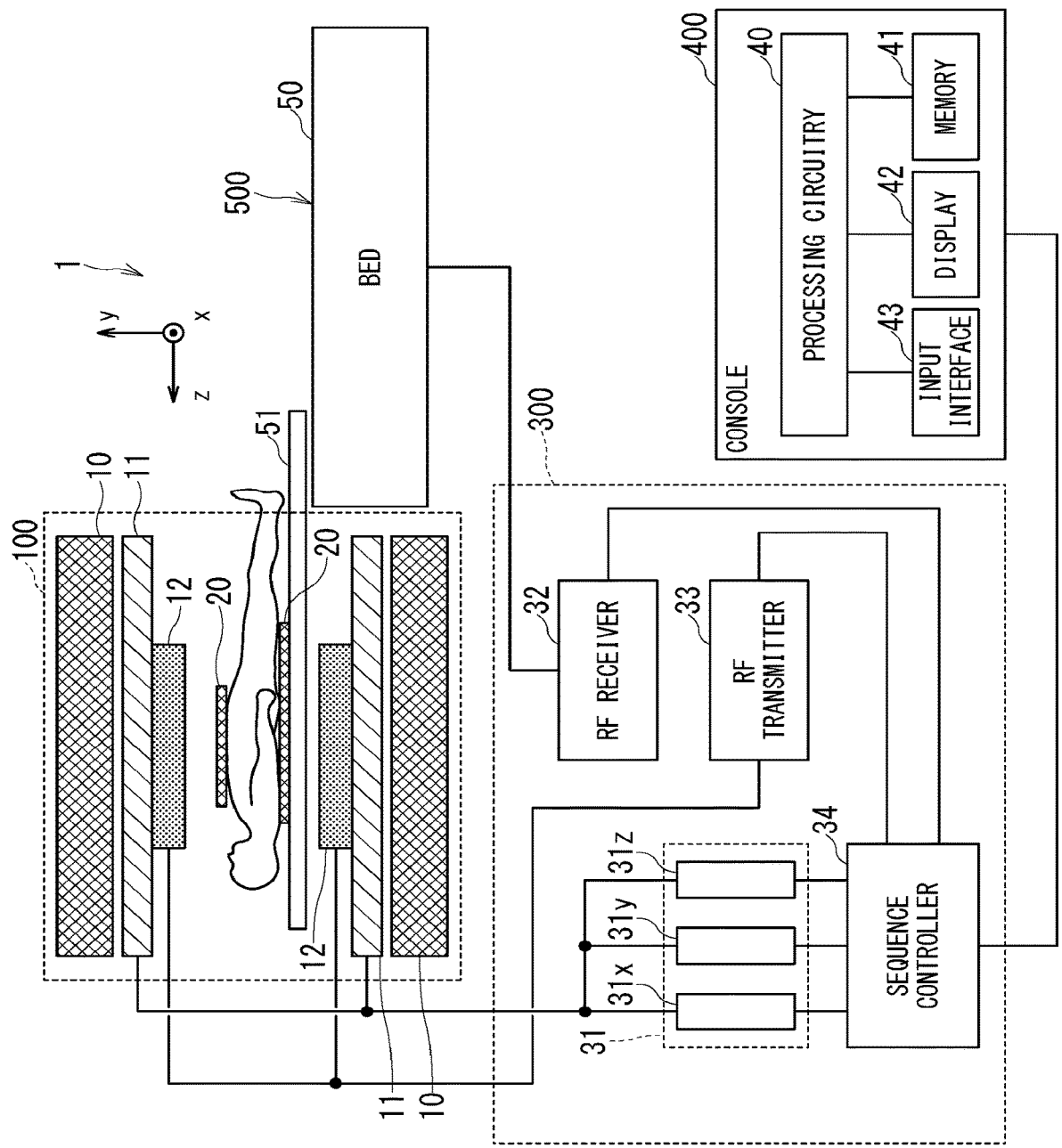
FIG. 1 is a block diagram illustrating a configuration of an MRI apparatus according to an embodiment.

FIG. 1 is a block diagram illustrating a configuration of an MRI apparatus 1 according to one embodiment. The MRI apparatus 1 includes a main body (also referred to as a gantry) 100, a control cabinet 300, a console 400, a bed 500, and local RF coils 20. The main body 100, the control cabinet 300, and the bed 500 are generally installed in an examination room. The console 400 is generally installed in a control room adjacent to the examination room.

The main body 100 includes a static magnetic field magnet 10, a gradient coil 11, and a WB (whole body) coil 12, and these components are housed in a cylindrical housing.

The control cabinet 300 includes three gradient coil power supplies 31 (31x for an X-axis, 31y for a Y-axis, and 31z for a Z-axis), an RF receiver 32, an RF transmitter 33, and a sequence controller 34.

The console 400 includes processing circuitry 40, a memory 41, a display 42, and an input interface 43. The console 400 functions as a host computer.

The bed 500 includes a bed body 50 and a table 51.

The static magnetic field magnet 10 of the main body 100 is substantially in the form of a cylinder, and generates a static magnetic field inside a bore into which an object P, e.g., a patient, is transported. The bore is a space inside the cylindrical structure of the main body 100. The static magnetic field magnet 10 may include a superconducting coil inside, and the superconducting coil is cooled down to an extremely low temperature by liquid helium. The static magnetic field magnet 10 generates a static magnetic field by supplying the superconducting coil with an electric current provided from a non-illustrated static magnetic field power supply in an excitation mode. Afterward, the static magnetic field magnet 10 shifts to a permanent current mode, and the static magnetic field power supply is separated. Once it enters the permanent current mode, the static magnetic field magnet 10 continues to generate a static magnetic field for a long time, e.g., over one year. Note that the static magnetic field magnet 10 is not limited to a superconducting magnet including a superconducting coil but may be a permanent magnet.

The gradient coil 11 is also substantially in the form of a cylinder similarly to the static magnetic field magnet 10, and is fixed to the inside of the static magnetic field magnet 10. The gradient coil 11 forms gradient magnetic fields in the respective directions of the x-axis, the y-axis, and the z-axis by using electric currents supplied from the gradient coil power supplies 31x, 31y, and 31z.

The bed body 50 of the bed 500 can move the table 51 in the vertical direction and in the horizontal direction. For instance, the bed body 50 moves the table 51 with an object loaded thereon to a predetermined height before imaging. Afterward, when the object is imaged, the bed body 50 moves the table 51 in the horizontal direction so as to move the object to the inside of the bore.

The WB body coil 12 is shaped substantially in the form of a cylinder to surround the object, and is fixed to the inside of the gradient coil 11. The WB coil 12 applies RF pulses transmitted from the RF transmitter 33 to the object. The WB coil 12 receives magnetic resonance signals, i.e., MR signals emitted from the object due to excitation of hydrogen nuclei.

The MRI apparatus 1 may include the local RF coils 20 as shown in FIG. 1 in addition to the WB coil 12. Each of the local RF coils 20 is placed close to the body surface of the object. There are various types for the local RF coils 20. For instance, as the types of the local RF coils 20, as shown in FIG. 1, there are a body coil attached to the chest, abdomen, or legs of the object and a spine coil attached to the backside of the object. The local RF coils 20 may be of a type dedicated for receiving MR signals, another type dedicated for transmitting RF pulses, or still another type for performing both of transmitting RF pulses and receiving MR signals. The local RF coils 20 are configured to be attachable to and detachable from the table 51 via a cable, for instance.

The RF receiver 32 performs A/D (Analog to Digital) conversion on the channel signal from the WB coil 12 and/or the local RF coils 20, i.e., the MR signals, and outputs the converted MR signals to the sequence controller 34. The MR signals converted into digital signals are sometimes referred to as raw data.

The RF transmitter 33 generates an RF pulse based on an instruction from the sequence controller 34. The generated RF pulse is transmitted to the WB coil 12 and applied to the object. MR signals are generated from the object by the application of the RF pulse. The MR signals are received by the local RF coils 20 and/or the WB coil 12. The RF transmitter 33 will be described in detail later with reference to FIGS. 3-6.

The sequence controller 34 performs a scan of the object by driving each of the gradient coil power supplies 31, the RF receiver 32, and the RF transmitter 33 and under the control of the console 400. When the sequence controller 34 receives raw data from the RF receiver 32 by performing a scan, the sequence controller 34 transmits the received raw data to the console 400. The sequence controller 34 will be described in detail later with reference to FIGS. 3-6.

The sequence controller 34 includes non-illustrated processing circuitry. This processing circuitry is configured of hardware such as a processor for executing predetermined programs, an FPGA (Field Programmable Gate Array), and an ASIC (Application Specific Integrated Circuit).

The console 400 includes a memory 41, a display 42, an input interface 43, and processing circuitry 40.

The memory 41 is a recording medium including a ROM (Read Only memory) and a RAM (Random Access Memory) in addition to an external memory device such as a HDD (Hard Disk Drive) and an optical disc device. The memory 41 stores various programs executed by the processor of the processing circuitry 40 as well as various types of data and information.

The display 42 is a display device such as a liquid crystal display panel, a plasma display panel, and an organic EL panel.

The input interface 43 includes various devices for an operator to input various types of information and data. The input interface 43 is configured of, e.g., a mouse, a keyboard, a trackball, and/or a touch panel.

The processing circuitry 40 is, e.g., a circuit equipped with a CPU (Central Processing Unit) and/or a special-purpose or general-purpose processor. The processor implements various functions by executing the various programs stored in the memory 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

Next, relationship between the RF pulse and the feedback processing will be described.

Figure 2:
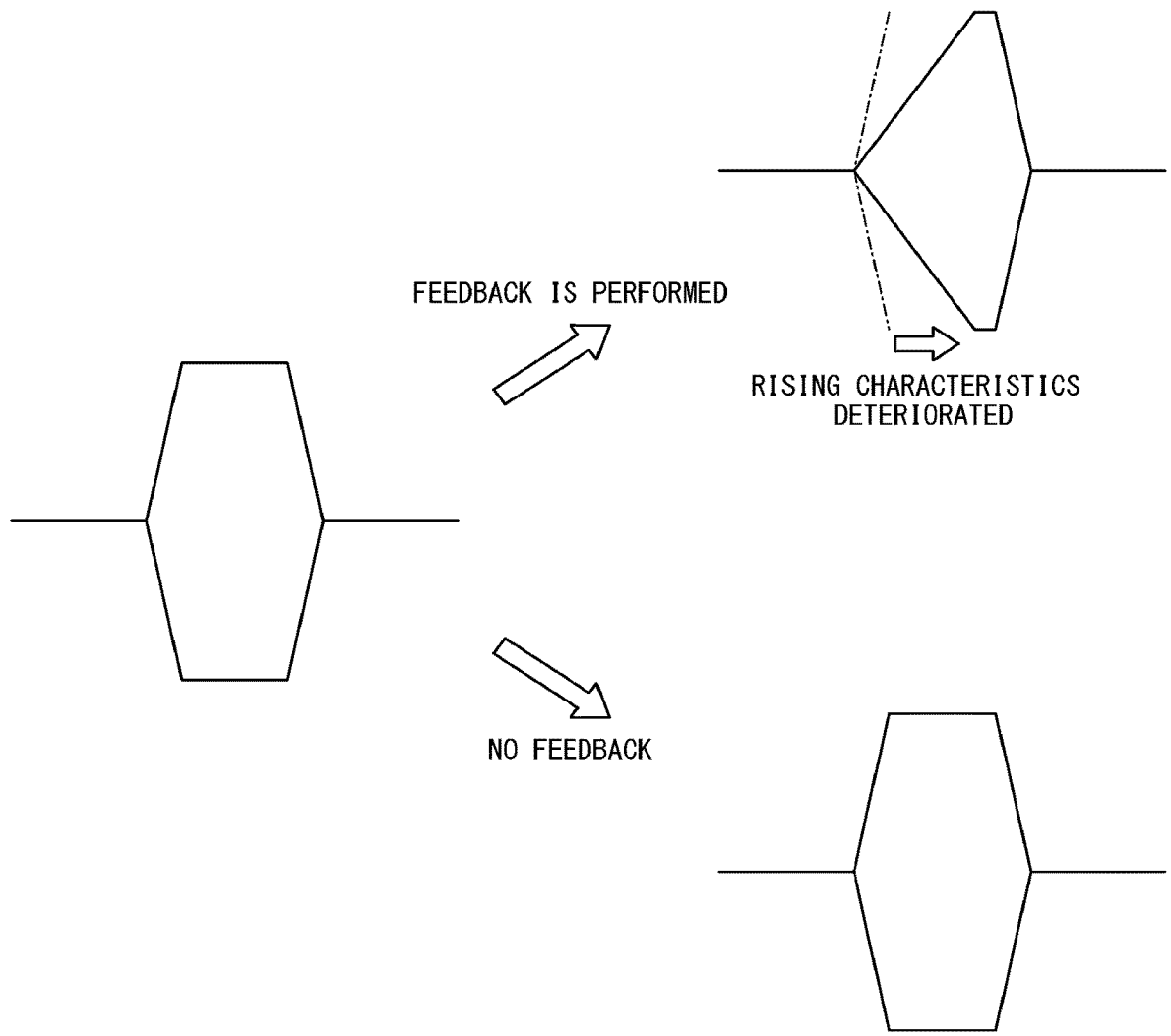
FIG. 2 is a schematic diagram illustrating the influence of the feedback processing on the rise of the RF pulse in the case of using a trapezoidal wave as the RF pulse.

FIG. 2 is a schematic diagram illustrating the influence of the feedback processing on the rise of the RF pulse in the case of using a trapezoidal wave as the RF pulse.

Figure 3:
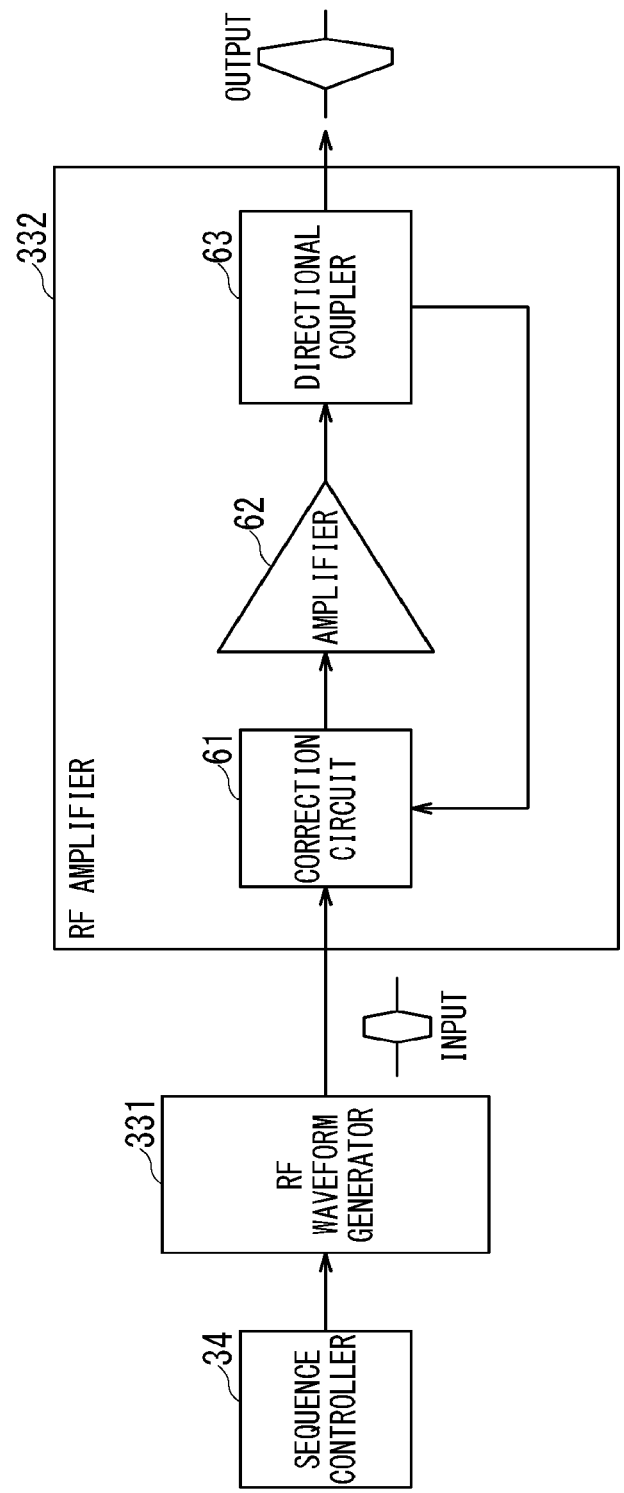
FIG. 3 is a schematic diagram illustrating a conventional configuration for performing the feedback processing.

FIG. 3 is a schematic diagram illustrating a conventional configuration for performing the feedback processing.

As shown in FIG. 3, a conventional RF transmitter 33 includes, e.g., an RF waveform generator 331 and an RF amplifier 332. The digital waveform of the RF pulse generated by the sequence controller 34 is converted from digital to analog by the RF waveform generator 331 and inputted to the RF amplifier 332.

The RF amplifier 332 includes a correction circuit 61, an amplifier 62, and a directional coupler 63. The RF pulse inputted to the RF amplifier 332 (hereinafter, referred to as the input RF pulse) is amplified by the amplifier 62 and outputted. The RF pulse outputted from the amplifier 62 (hereinafter, referred to as the output RF pulse) is inputted to the directional coupler 63, then outputted via the directional coupler 63, and then applied to the object via, e.g., the WB coil 12. The directional coupler 63 extracts a part of the output RF pulse and supplies to the correction circuit 61. The correction circuit 61 corrects, i.e., performs the feedback processing, at least one of the phase and gain of the input RF pulse so as to improve the stability and nonlinearity of the output RF pulse of the amplifier 62, thereby generating the RF pulse subjected to the correction (hereinafter referred to as the corrected RF pulse).

Recently, imaging methods with very short TE (Echo Time) such as UTE (Ultrashort TE) and ZTE (Zero TE) have come to be used. In this type of imaging method, an ultrashort square wave and/or an ultrashort trapezoidal wave (e.g., pulse width of about 20 to 40 μsec) is used as an RF pulse.

In the feedback processing, an RF pulse is delayed in order to avoid the risk of oscillation in some cases. For this reason, when the input RF pulse is a square wave or trapezoidal wave, its rise is steep and the slew rate (voltage fluctuation value per unit time [V/sec]) is high, and consequently, the input RF pulse is greatly affected by the delay due to the feedback processing.

Accordingly, the waveform of the output RF pulse of the amplifier 62 differs from the desired or intended waveform, and the area also changes significantly as shown in the upper right of FIG. 2. When the pulse width of the input RF pulse is short, the output RF pulse may fall before rising completely. When the waveform of the output RF pulse of the amplifier 62 differs from the desired waveform, deterioration of slice characteristics and insufficient flip angle may be caused, which degrades image quality in some cases.

When a sinc pulse having a pulse width of, e.g., about 1000 μsec is used as the input RF pulse, the influence on image quality is negligible even when its rise is delayed. Thus, in the case of using this type of input RF pulse, it is preferable to perform the feedback processing in order to improve the stability and nonlinearity of the output RF pulse of the amplifier 62 in view of variations in the characteristics of the amplifier 62.

For this reason, the MRI apparatus 1 according to the present embodiment determines whether the feedback processing is to be performed on the input RF pulse, on the basis of the determination value having been set according to the slew rate of the input RF pulse. The MRI apparatus 1 may determine the slew rate of the rising edge of the input RF pulse of the amplifier 62 and control whether the feedback processing is to be performed on the input RF pulse according to the determined slew rate. The control and the calculation of the slew rate are performed by at least one of the RF transmitter 33 and the sequence controller 34.

Next, a description will be given of the configuration and operation of the RF transmitter 33 and the sequence controller 34 according to the present embodiment.

Figure 4:
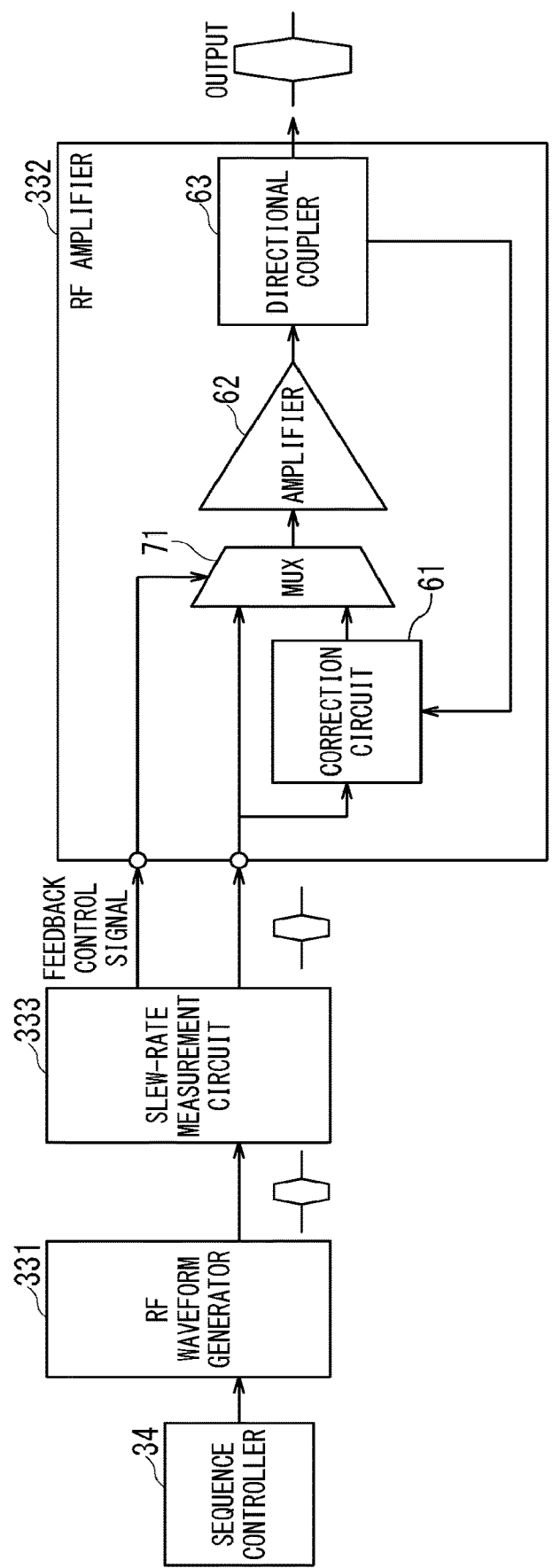
FIG. 4 is a block diagram for illustrating a configuration according to the first control method of selectively switching the feedback processing to be performed or not according to the slew rate in the present embodiment.

FIG. 4 is a block diagram for illustrating the configuration according to the first control method of selectively switching the feedback processing to be performed or not according to the slew rate in the present embodiment. The configuration according to the first control method has a configuration in which a slew-rate measurement circuit 333 and a multiplexer 71 are added to the conventional configuration.

In the configuration according to the first control method of selectively switching the feedback processing to be performed or not according to a slew rate, the RF transmitter 33 includes the RF waveform generator 331, the RF amplifier 332, and the slew-rate measurement circuit 333.

The RF waveform generator 331 includes a circuit equipped with a dedicated or general-purpose processor. The RF waveform generator 331 may be configured of hardware such as an FPGA or an ASIC. The RF waveform generator 331 is provided separately from the RF amplifier 332 and is provided in the output stage of the sequence controller 34 and also provided in the input stage of the slew-rate measurement circuit 333. The RF waveform generator 331 performs digital-to-analog conversion on the digital waveform generated by the sequence controller 34 so as to generate the input RF pulse, and then outputs the input RF pulse to the slew-rate measurement circuit 333. The RF waveform generator 331 is an example of the RF waveform generation circuit.

The RF amplifier 332 further includes a multiplexer 71 in addition to the configuration of the conventional RF amplifier 332 shown in FIG. 3. The RF amplifier 332 is an example of an RF amplification circuit.

The multiplexer 71 receives the input RF pulse and the corrected RF pulse subjected to the feedback processing by the correction circuit 61. The multiplexer 71 then selects either the input RF pulse without correction or the corrected RF pulse according to the control signal outputted from the slew-rate measurement circuit 333, and outputs the selected RF pulse to the amplifier 62. The correction circuit 61 is an example of the correction circuit. The multiplexer 71 is an example of the switching circuit.

In the configuration according to the first control method shown in FIG. 4, the slew-rate measurement circuit 333 is provided separately from the RF amplifier 332 and is connected to the output stage of the RF waveform generator 331 and also connected to the input stage of the RF amplifier 332. The slew-rate measurement circuit 333 includes a calculation circuit configured to determine the slew rate of the rising edge of the input RF pulse of the amplifier 62, and further includes a control circuit configured to control whether the feedback processing is to be performed on the input RF pulse or not, depending on the slew rate of the input RF pulse. The slew-rate measurement circuit 333 is an example of the measurement circuit, and is also an example of the calculation circuit and the control circuit that are included in the measurement circuit.

Specifically, the slew-rate measurement circuit 333 calculates the slew rate of the rising edge of the input RF pulse on a real-time basis each time the input RF pulse is inputted from the RF waveform generator 331. When the calculated slew rate is smaller than the threshold value, the slew-rate measurement circuit 333 supplies a control signal (hereinafter referred to as the feedback control signal) to the multiplexer 71, whereby the slew-rate measurement circuit 333 issues a command to the multiplexer 71 to output the corrected RF pulse. When the calculated slew rate is equal to or larger than the threshold value, the slew-rate measurement circuit 333 supplies a feedback control signal to the multiplexer 71, whereby the slew-rate measurement circuit 333 instructs the multiplexer 71 to output the input RF pulse to the amplifier 62 without correcting the input RF pulse.

According to the configuration according to the first control method shown in FIG. 4, whether to perform the feedback processing on the input RF pulse can be switched according to the slew rate of the input RF pulse. For this reason, when the input RF pulse used in an imaging sequence such as UTE or ZTE is an ultrashort square wave and/or an ultrashort trapezoidal wave, an uncorrected input RF pulse without being subjected to the feedback processing can be inputted to the amplifier 62, and thus, deterioration of the rising waveform can be prevented. When the input RF pulse has a low slew rate waveform like a sinc pulse, the corrected RF pulse having been subjected to the feedback processing can be inputted to the amplifier 62, and thus, stability and nonlinearity of the output RF pulse of the amplifier 62 can be reliably improved.

Although a description has been given of the case where the slew-rate measurement circuit 333 is provided separately from the RF amplifier 332 in the configuration according to the first control method shown in FIG. 4, the slew-rate measurement circuit 333 may be provided in the RF amplifier 332 as its modification. In this case, the configuration equivalent to the configuration shown in FIG. 4 can be realized only by replacing the RF amplifier 332 without changing the respective configurations of the sequence controller 34 and the RF waveform generator 331 from their conventional configurations.

FIG. 5 is a block diagram for illustrating a configuration according to the second control method of selectively switching the feedback processing to be performed or not according to the slew rate in the present embodiment. The configuration according to the second control method differs from the configuration according to the first control method in that the sequence controller 34 includes the calculation circuit and the control circuit of the slew-rate measurement circuit 333, and the slew-rate measurement circuit 333 is omitted. Since the other configuration and functions are substantially the same as the configuration according to the first control method shown in FIG. 4, the same reference signs are assigned to the same components as the first control method and duplicate description is omitted.

In the configuration according to the second control method shown in FIG. 5, the sequence controller 34 determines the conditions of the RF pulse supplied to the amplifier 62 on the basis of the imaging sequence. Specifically, the sequence controller 34 generates a digital waveform that is the source of the input RF pulse. Additionally, the sequence controller 34 includes the calculation circuit and the control circuit described above. Specifically, the sequence controller 34 calculates the slew rate of the rising edge of the input RF pulse. When the calculated slew rate is smaller than the threshold value, the sequence controller 34 supplies the multiplexer 71 with the control signal (hereinafter referred to as the feedback control signal), whereby the sequence controller 34 instructs the multiplexer 71 to output the corrected RF pulse. When the calculated slew rate is equal to or larger than the threshold value, the sequence controller 34 supplies the multiplexer 71 with the feedback control signal, whereby the sequence controller 34 instructs the multiplexer 71 to output the input RF pulse to the amplifier 62 without correcting the input RF pulse.

The sequence controller 34 can obtain information on the slew rate of the input RF pulse in order to determine the conditions of the RF pulse supplied to the amplifier 62. The information on the slew rate of the input RF pulse includes information on the imaging sequence. The sequence controller 34 can acquire information on the imaging sequence. When the imaging sequence and the slew rate of the input RF pulse are associated with each other in advance, the sequence controller 34 may set, for each imaging sequence, a determination value as to whether to correct the input RF pulse according to the slew rate corresponding to the imaging sequence. In this case, when the control circuit included in the sequence controller 34 acquires the information on the imaging sequence, the control circuit may control whether to correct the input RF pulse, on the basis of the determination value having been set for each imaging sequence. In this case, the sequence controller 34 does not have to calculate the slew rate directly from the waveform of the input RF pulse in real time and may not include the calculation circuit.

The configuration according to the second control method shown in FIG. 5 also achieves the same effects as the configuration according to the first control method shown in FIG. 4. The configuration according to the second control method shown in FIG. 5 can be said to be simpler than the configuration according to the first control method shown in FIG. 4 in that the slew-rate measurement circuit 333 is omitted.

Figure 6:
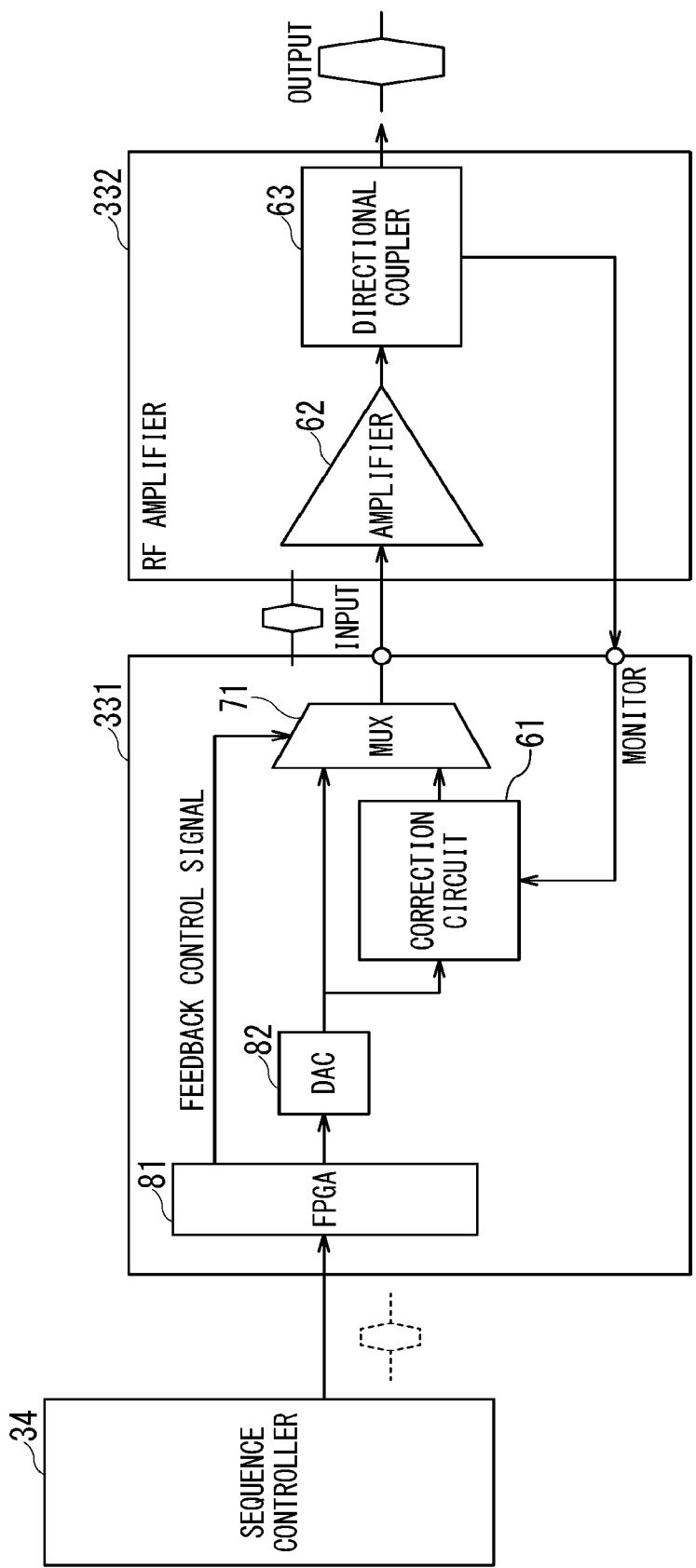
FIG. 6 is a block diagram for illustrating a configuration according to the third control method of selectively switching the feedback processing to be performed or not according to the slew rate in the present embodiment.

FIG. 6 is a block diagram for illustrating a configuration according to the third control method of selectively switching the feedback processing to be performed or not according to the slew rate in the present embodiment. The difference in configuration between the first and third control methods is that an FPGA 81 of the RF waveform generator 331 achieves the functions of the calculation circuit and the control circuit of the slew-rate measurement circuit 333, and the slew-rate measurement circuit 333 is omitted.

In the configuration according to the third control method shown in FIG. 6, the RF amplifier 332 has an amplifier 62 and a directional coupler 63, and the correction circuit 61 and the multiplexer 71 are included in the RF waveform generator 331.

In the configuration according to the third control method shown in FIG. 6, the RF waveform generator 331 is provided separately from the RF amplifier 332 and is connected to the output stage of the sequence controller 34 and also connected to the input stage of the RF amplifier 332, similarly to the configuration according to the second control method shown in FIG. 5. In the configuration according to the third control method shown in FIG. 6, the RF waveform generator 331 includes the correction circuit 61 and the multiplexer 71 in addition to the FPGA 81 and a DAC (Digital-to-Analog Converter) 82.

The FPGA 81 of the RF waveform generator 331 calculates the slew rate of the rising edge of the input RF pulse on the basis of the digital waveform inputted from the multiplexer 71, and outputs the feedback control signal according to the calculated slew rate. The DAC 82 converts the digital waveform generated by the sequence controller 34 from digital to analog so as to generate the input RF pulse.

The configuration according to the third control method shown in FIG. 6 also achieves the same effects as the configuration according to the first control method shown in FIG. 4. As compared with the respective configurations of the first and second control methods shown in FIG. 4 and FIG. 5, the configuration according to the third control method shown in FIG. 6 is not required to add the multiplexer 71 to the RF amplifier 332 and can use an RF amplification circuit as the general-purpose RF amplifier 332.

As a modification of the first to third control methods described above, the delay time (response time) of the feedback processing by the correction circuit 61 may be controlled according to the type and/or slew rate of the waveform of the input RF pulse. For example, when the input RF pulse is a trapezoidal wave, to use a delay time shorter than a delay time of the sinc wave can reduce the influence of the delay due to the feedback processing while advantages of the feedback processing kept.

According to at least one embodiment described above, whether to perform the feedback processing on the input RF pulse of the amplifier 62 can be switched according to the slew rate of the input RF pulse.

The processing circuitry in the above-described embodiments is an example of the processing circuitry described in the claims. In addition, the term "processor" used in the explanation in the above-described embodiments, for instance, refer to circuitry such as dedicated or general purpose CPUs (Central Processing Units), dedicated or general-purpose GPUs (Graphics Processing Units), or ASICs (Application Specific Integrated Circuits), programmable logic devices including SPLDs (Simple Programmable Logic Devices), CPLDs (Complex Programmable Logic Devices), and FPGAs (Field Programmable Gate Arrays), and the like. The processor implements various types of functions by reading out and executing programs stored in the memory circuitry.

In addition, instead of storing programs in the memory circuitry, the programs may be directly incorporated into the circuitry of the processor. In this case, the processor implements each function by reading out and executing each program incorporated in its own circuitry. Moreover, although in the above-described embodiments an example is shown in which the processing circuitry configured of a single processor implements every function, the processing circuitry may be configured by combining plural processors independent of each other so that each processor implements each function of the processing circuitry by executing corresponding program. When a plurality of processors are provided for the processing circuitry, the memory medium for storing programs may be individually provided for each processor, or one memory circuitry may collectively store programs corresponding to all the functions of the processors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An MRI apparatus comprising:
an amplifier amplifying an RF pulse and supplying the amplified RF pulse to an RF coil; and
a control circuit configured to determine whether to input to the amplifier either an input RF pulse without correction or the input RF pulse which is corrected based on a slew rate of the input RF pulse, the correction being performed using an output RF pulse which is outputted from the amplifier and is fed back to an input side of the amplifier.

2. The MRI apparatus according to claim 1,
wherein the control circuit is configured to perform determination in such a manner that the input RF pulse is corrected when the slew rate is smaller than a threshold value, and to perform the determination in such a manner that the input RF pulse is not corrected when the slew rate is equal to or larger than the threshold value.

3. The MRI apparatus according to claim 2, further comprising a sequence controller configured to determine a condition of an RF pulse supplied to the amplifier,
wherein the control circuit is configured to determine whether to correct the input RF pulse by acquiring information on the slew rate from the sequence controller.

4. The MRI apparatus according to claim 2, further comprising a calculation circuit configured to detect the input RF pulse and calculate the slew rate.

5. The MRI apparatus according to claim 4,
wherein the calculation circuit and the control circuit are provided separately from an RF amplification circuit that includes the amplifier.

6. The MRI apparatus according to claim 5,
wherein the calculation circuit and the control circuit are included in a measurement circuit provided in an output stage of an RF waveform generation circuit and provided in an input stage of the RF amplification circuit, and
wherein the RF waveform generation circuit is configured to generate the input RF pulse by performing digital-to-analog conversion on a digital waveform outputted from a sequence controller configured to generate a digital waveform of the input RF pulse, and is configured to output the generated input RF pulse to the RF amplification circuit.

7. The MRI apparatus according to claim 5,
wherein the calculation circuit and the control circuit are included in a sequence controller configured to generate a digital waveform of the input RF pulse.

8. The MRI apparatus according to claim 5, wherein:
the calculation circuit and the control circuit are included in an RF waveform generation circuit;
the RF waveform generation circuit is provided in an output stage of a sequence controller that is configured to generate a digital waveform of the input RF pulse and is provided in an input stage of the RF amplification circuit; and
the RF waveform generation circuit is configured to generate the input RF pulse by performing digital-to-analog conversion on the digital waveform outputted from the sequence controller, and is configured to output the generated input RF pulse to the RF amplification circuit.

9. The MRI apparatus according to claim 4,
wherein the calculation circuit and the control circuit are included in a RF amplification circuit that includes the amplifier.

10. The MRI apparatus according to claim 1, further comprising a switching circuit configured to
receive the input RF pulse without correction and a corrected RF pulse obtained by correcting the input RF pulse based on the output RF pulse, and
output either the input RF pulse without correction or the corrected RF pulse and input the same to the amplifier based on a determination result of the control circuit.

11. The MRI apparatus according to claim 10, further comprising a calculation circuit configured to detect the input RF pulse and calculate the slew rate,
wherein the control circuit is configured to control the switching circuit according to the slew rate calculated by the calculation circuit, thereby switching which one of the input RF pulse without correction and the corrected RF pulse is to be inputted to the amplifier according to the slew rate.

12. The MRI apparatus according to claim 10, further comprising a correction circuit configured to correct at least one of phase and gain of the input RF pulse based on the output RF pulse to generate the corrected RF pulse, and supply the corrected RF pulse to the switching circuit.

13. An RF amplification circuit comprising:
a switching circuit configured to
receive an input RF pulse without correction and a corrected RF pulse that is obtained by feeding back an output RF pulse outputted from an amplifier to an input side of the amplifier to correct the input RF pulse to be inputted to the amplifier, and
output either the input RF pulse or the corrected RF pulse and input the same to the amplifier; and
a control circuit configured to switch which one of the input RF pulse and the corrected RF pulse is to be inputted to the amplifier based on a determination value being set according to a slew rate of the input RF pulse.

14. An MRI apparatus comprising:
an amplifier configured to amplify an RF pulse and supply the amplified RF pulse to an RF coil; and
a control circuit configured to
determine whether to input to the amplifier either an input RF pulse without correction or the input RF pulse which is corrected based on a waveform type of the input RF pulse, the correction being performed using an output RF pulse which is outputted from the amplifier and is fed back to an input side of the amplifier by feedback processing, and
control a delay time in the feedback processing according to the waveform type of the input RF pulse.

15. The MRI apparatus according to claim 14,
wherein the control circuit is configured to determine the delay time according to a slew rate of a rising edge of the input RF pulse.

* * * * *